United States Patent [19]

Pelgrom

[11] Patent Number: 4,688,220

[45] Date of Patent: Aug. 18, 1987

[54] DISTRIBUTION OF A DATA STREAM IN A SERIES-PARALLEL-SERIES DIGITAL ARRANGEMENT COMPRISING DIGITAL UNITS HAVING AT LEAST ONE DEFECTIVE ELEMENT

[75] Inventor: Marcellinus J. M. Pelgrom, Eindhoven, Netherlands

[73] Assignee: U.S. Philips Corporation, New York, N.Y.

[21] Appl. No.: 734,379

[22] Filed: May 15, 1985

[30] Foreign Application Priority Data

May 16, 1984 [NL] Netherlands ............... 8401569

[51] Int. Cl.$^4$ ............................................. G11C 11/40
[52] U.S. Cl. ........................................ 371/10; 365/200
[58] Field of Search .............. 364/200, 900; 371/10, 371/20, 22; 365/200

[56] References Cited

U.S. PATENT DOCUMENTS

| | | | |
|---|---|---|---|
| 4,254,477 | 3/1981 | Hsia et al. ........................... | 371/10 |
| 4,433,413 | 2/1984 | Fasang ................................ | 364/900 |
| 4,566,081 | 1/1986 | Ochii .................................. | 371/10 |
| 4,584,682 | 4/1986 | Shah et al. .......................... | 371/10 |
| 4,592,024 | 5/1986 | Sakai et al. ......................... | 371/10 |

*Primary Examiner*—Gareth D. Shaw
*Assistant Examiner*—John Mills
*Attorney, Agent, or Firm*—Jack E. Haken; James J. Cannon, Jr.

[57] ABSTRACT

One or more defective elements regularly occur in series-parallel-series digital units comprising several elements. The described system offers a solution for the construction of a series-parallel-series digital system by means of a number of series-parallel-series digital units comprising one or more defective elements; in this system only a part of the data stream passing through the system appears as being unreliable on the output thereof. Moreover, said unreliable part will always be situated within the same serial data stream, while the other serial data stream on the output will not be affected thereby.

7 Claims, 2 Drawing Figures

DISTRIBUTION OF A DATA STREAM IN A SERIES-PARALLEL-SERIES DIGITAL ARRANGEMENT COMPRISING DIGITAL UNITS HAVING AT LEAST ONE DEFECTIVE ELEMENT

BACKGROUND OF THE INVENTION

The invention relates to a series-parallel-series digital system with at least one storage function, comprising a first number of n (n>1) series-parallel-series digital units, each of which comprises a second number of k(k>1) elements, a further number r (1≦r≦k) thereof being defective in each unit, each digital unit comprising a serial input and a serial output for connection to a bus which comprises at least p(p>1) channels for the serial transport of a data stream of digital bits via each channel.

Such a series-parallel-series digital system is known from the article "Multiplexed partial-good chip scheme employing defective loops as selectors for all-good chips" by F. J. Aichelmann, Jr., published in I.B.M. T.D.B., Vol. 22, No. 1, June 1979, pp. 138-139. The series-parallel-series digital system described therein is a series-parallel-series shift register system in which each memory unit comprises at least one defective memory element. Consequently, it is not possible to store information in said defective memory element in a reliable manner. In order to enable reliable information storage, however, the system includes an additional memory unit which comprises only memory elements which are not defective. When such a defective memory element is addressed, the relevant address is converted into an address for the additional memory unit in order to read or write information from or into the additional memory unit.

However, the total capacity of the system will not be required in given circumstances or for given applications. This is the case, for example when not all channels of the bus are used, for example in digital television where only 7 of 8 bus channels are used. It may also be that operations need be performed only on words which are transported via given channels of the bus, or that the supply of information requires only a part of the capacity of the system. It may also be that, for example when multibit words are used, unreliability occurs in the least-significant bit due to a defective element which, however, has no adverse effects on the further processing of the relevant word. For this type of circumstances and applications it is feasible to use only digital units which comprise one or sometimes more than one defective element and which are cheaper than all-good digital units.

SUMMARY OF THE INVENTION

It is the object of the invention to provide a series-parallel-series digital system which utilizes units comprising one or more defective elements and in which the data stream is on the output of the digital system affected to only a minor degree by the presence of the defective elements, the part of the data stream which has become unreliable due to said defective elements being situated in an accurately defined location on the bus.

To achieve this, a series-parallel-series digital system in accordance with the invention is characterized in that each digital unit comprises at least (p-r) (1≦p-r<k) non-defective elements, the serial input of each digital unit being connected to a respective serial connection point of a respective data traffic control system which comprises p parallel connection points for connection to a respective one of the p channels of the bus, said data traffic control system being suitable for redistributing the data stream originating from the bus by successively fetching, within a given period, a number of bits from each channel and for conducting, in cooperation with the relevant digital unit, the bits originating from (p-r) different channels through the (p-r) non-defective elements, the serial output of each digital unit being connected to a respective serial connection point of the respective data traffic control system which is also suitable for redistributing the data stream on said serial output by rearranging the bits on said serial output into a pattern which substantially corresponds to the pattern of the bits on the bus. Due to the redistribution of the data stream from the bus as performed by the data traffic control systems it is ensured that the various bits which are transported via r different channels are conducted through r defective elements which are spread over the various digital units, the bits which are transported via the other channels being conducted through (p-r) non-defective elements per digital unit. The data traffic control systems also ensure that the data stream on the serial outputs of the digital units is reorganized so that the bits which are conducted through the defective elements are applied to the same channels. Consequently, the system can be used for p-r channels whose position on the bus is accurately known.

A preferred embodiment of a series-parallel-series digital system in accordance with the invention is characterized in that each data traffic control system comprises a first and a second data traffic control sub-system, each of which comprises a respective serial connection point and p respective parallel connection points, the serial connection point of the first data traffic control sub-system being connected to the serial input of its respective digital unit, the serial connection point of the second data traffic control sub-system being connected to the serial output of its respective digital unit. The use of a first and a second data traffic control sub-system optimizes the flow of data bits through the digital system because the data traffic on the serial input and the serial output of the digital unit thus has independent access to the bus.

A further preferred embodiment of a series-parallel-series digital system in accordance with the invention is characterized in that the first and the second data traffic control sub-system comprise a first and a second switching system, respectively, comprising p switching positions which are successively activated in order to establish a connection between one of the parallel connection points and the serial connection point, the n digital units being positioned with respect to the successive switching positions of their first switching system in such a manner that the defective elements each time receive bits originating from the same r channels. In this system the defective elements may be situated in different locations with respect to the sequence in which data bits are present thereto. However, it is important to ensure that the digital units are included in the system in accordance with the switching positions of their respective switching systems.

Another preferred embodiment of a series-parallel-series digital system in accordance with the invention is characterized in that the data stream presented to the serial input of each digital unit can be distributed among the various elements of the relevant unit in a well-defined sequence, the (p-r) non-defective elements in each digital unit being situated each time in the same location with respect to said sequence, the first and the second data traffic control sub-system comprising a first and a second switching system, respectively, comprising p switching positions which are successively activated in order to establish a connection between one of the parallel connection points and the serial connection point, in series with each digital unit there being connected at least one delay element for delaying the data stream between said first and said second switching system by at least one period. However, this is subject to the condition that the defective elements must always be situated in the same location with respect to the sequence in which data bits are presented thereto. However, in this case there is no requirement to be satisfied as regards correspondence to the position of the switching systems.

Preferably, the number of defective elements per digital unit amounts to one. The usability of the system then remains substantially unaffected.

BRIEF DESCRIPTION OF THE DRAWINGS

The invention will be described in detail hereinafter with reference to the accompanying drawing; therein.

DESCRIPTION OF THE PREFERRED EMBODIMENTS

Figure 1:
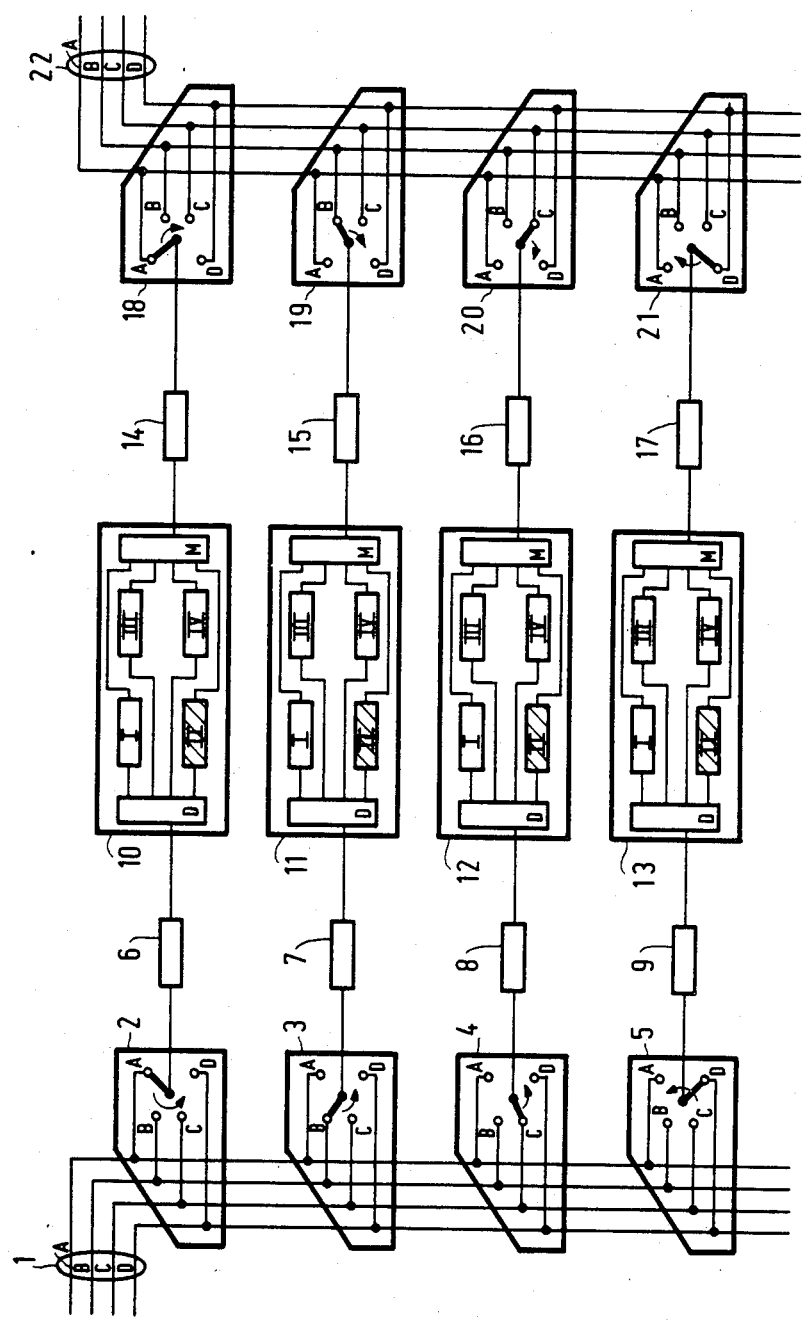
FIG. 1 shows a first embodiment of a series-parallel-series digital system in accordance with the invention.

FIG. 1 shows a first embodiment of a series-parallel-series digital system in accordance with the invention. A shift register memory system has been chosen as the digital system for this first embodiment. The shift register memory system is connected between a first data bus 1 and a second data bus 22, each bus comprising n channels. The first and the second data bus are or can be essentially the same; herein the distinction has been made only for the sake of clarity. The present embodiment comprises n=4 channels which are denoted by the letters A, B, C and D. Data bits are serially transported via each of said channels. Four switching systems 2, 3, 4 and 5, and 18, 19, 20 and 21, respectively, are connected to the first bus 1 and the second bus 22, respectively. These switching systems are formed, for example by T.I. 74 LS 153 (T.I.=Texas Instruments) integrated circuits. Each switching system has four feasible switching positions (A, B, C, and D), in each position a connection being established to a respective channel.

The shift register memory system furthermore comprises n digital memory units (10, 11, 12 and 13) which are series-parallel-series memory units. The memory unit 10 comprises an input which is connected, via a delay element 6 (for example, T.I. 74 LS 164) to the switching system 2, and an output which is connected to the switching system 18 via a delay element 14. The switching system and the delay element together form a data traffic control sub-system. Analogously, the memory units 11, 12 and 13 are connected to their respective switching systems via respective delay elements 7, 8, 9 and 15, 16, 17.

Each memory unit comprises k (k>1) memory elements (I, II, III, IV), k being equal to 4 in the present embodiment. Each memory unit also comprises a demultiplexer (D) and a multiplexer (M). The demultiplexer (D) distributes the incoming serial data stream in parallel among the various memory elements and the multiplexer (M) combines the data bits on the outputs of the various elements in order to form a data word which is subsequently serially output on the serial output of the memory unit.

It is assumed that the distribution of the data stream between the various memory elements of the same memory unit is the same for all memory units of the memory system. However, it will be apparent that the invention is by no means restricted thereto.

In a memory unit which comprises a plurality of memory elements it often occurs that one or more memory elements are defective due to manufacturing faults so that they do not satisfy the relevant specifications. However, this does not necessarily mean that the entire memory unit is unusable. The memory elements which are defective can be determined by means of known test and measurement methods.

For the embodiment shown in FIG. 1 it is assumed that it has been determined for each memory unit 10, 11, 12 and 13 that the memory element II is defective. The memory elements can still be used, but the information of the data bits conducted through the memory elements II are presented to the serial output of the memory units has become unreliable. By cooperation of the switching systems and the delay elements in the shift register memory system shown in FIG. 1 it is achieved that a signal is supplied on the second data bus 22, unreliable information being supplied by only one channel (in this case the channel B), while reliable information is supplied by all other channels.

The switching systems 2, 3, 4 and 5 are controlled by a control system (not shown in the Figure) which ensures that each time when 2 bits from the data stream in a channel have passed through a switching system, the relevant switching system is switched to the next position. Because the switching system has four switching positions, it outputs an 8-bit word on its output after one complete rotation. This 8-bit word contains 2 bits from each of the channels; the various bits of the various words will be denoted by lower-case letters $a_i$, $b_i$, $c_i$, $d_i$ ($1 \leq i \leq 8$), the letter denoting the channel of origin and the index the time sequence in which the bits are output on the output of the switching system. The direction of rotation of the switching system is denoted by an arrow.

It is also assumed that the switching systems 2, 3, 4 and 5 have a starting position as shown in FIG. 1. In this starting position, the switching system 2 conducts the bits $a_1$ and $a_2$ originating from the channel A to the delay element 6. The switching system 3 conducts the bits $b_1$ and $b_2$ originating from the channel B to the delay element 7 in its starting position. The same is applicable to the switching systems 4 and 5 which conduct the bits $c_1$ and $c_2$ and $d_1$ and $d_2$ to the delay elements 8 and 9, respectively, in their starting position (see table). Subsequently, the switching systems 2, 3, 4, and 5 are switched one position further. Consequently, the switching system 2 then conducts the bits $b_3$ and $b_4$ originating from the channel B to the delay element 6. The respective switching systems 3, 4, 5 conduct the bits $c_3$ and $c_4$, $d_3$ and $d_4$, $a_3$ and $a_4$ to the associated delay element 7, 8, 9 respectively. This process of conducting two bits from a channel to a respective delay element and subsequently switching the switching systems one position further is continued for the various positions of the switch in a switching system.

When the switches of the switching system 2, 3, 4 and 5 reach their starting position again, they have performed one complete rotation, which means that from each channel 8 bits have been taken up by the system. However, due to the switching operation the various bits of the various channels have been distributed among the four memory units. The first column of the table at the end of this description contains data words as applied to the input of their respective delay elements.

As soon as a bit originating from a channel has passed through a switching system, it is applied to a delay element. The bits are presented to an output of each switching system at a well-defined bit frequency ($f_b$). The delay elements have a delay time which corresponds to an integer multiple of the bit period ($T_b = 1/f_b$). In the present embodiment, the delay elements have the following delay times:

delay element 6: $0 \times T_b$
delay element 7: $2 \times T_b$
delay element 8: $4 \times T_b$
delay element 9: $6 \times T_b$.

The second column of the table contains data words as output by the respective delay elements. The first and the second column of the table represents an instantaneous situation, which means that, for example bit $b_1$ is output on the output of the switching system 3 at substantially the same instant as the bit $a'_7$ on the output of the delay element 7. The accent denotes that the relevant bits originate from the preceding word.

The delay element 6 has a delay time of $0 \times T_b$ which is the same as if the bits were applied directly to the memory unit 10. In a practical embodiment of the system such a delay element 6 can be dispensed with. The delay element 7 has a delay time of $2 \times T_b$. Consequently, the data stream on the output of the delay element 7 exhibits a delay of 2 bits with respect to the input data stream. Therefore, when for example the bit $b_1$ is output on the output of the switching system 3, the bit $a'_7$ is output on the output of the delay element 7. The delay elements 8 and 9 delay the data stream by 4 and 6 bits, respectively, as indicated in the first and the second column of the table. The effect of the delay elements 6, 7, 8 and 9 consists in that the data stream on the input of the memory units 10, 11, 12 and 13 now exhibits a pattern which is uniform in time as appears from the second column of the table.

The data words as shown in the second column of the table are now presented to the respective memory units 10, 11, 12 and 13. Under the influence of the demultiplexer D, in the memory unit 10 the bits $a_1$ and $a_2$ are conducted through the memory element I, the bits $b_3$ and $b_4$ through the memory element II, the bits $c_5$ and $c_6$ through the memory element III and the bits $d_7$ and $d_8$ through the memory element IV. The data stream is conducted through the various memory elements of the other memory units 11, 12 and 13 in the same manner. It is assumed that the demultiplexers of the various memory units operate in synchronism with the given numbering of the elements.

Under the influence of the delay elements 6, 7, 8 and 9 and the demultiplexers of the various memory units, the various bits of the data stream originating from the channel B of the first bus 1 are conducted each time to the memory element II. As has already been stated, the memory elements II in each of the memory units are defective. This means that on the output of the various memory units unreliable information will be present each time at the location of the bits $b_i$ in the data stream. This is indicated by means of dashes in the data words as shown in the third column of the table. Thus, it appears from the third column that, due to the defective memory elements II, the data stream originating from the channel B is mutilated so that it no longer contains reliable information. However, only the data stream originating from the channel B has become unreliable and the data streams originating from all other channels still contains reliable information. Vis-à-vis the environment, i.e. on the connections of a system as shown in FIG. 1, only the data stream via channel B has become unreliable.

In order to conduct the various bits to the appropriate channel of the second data bus 22, the data stream as presented to the output of the memory units requires some reorganization. This is inter alia provided by the delay elements 14, 15, 16 and 17 and the switching systems 18, 19, 20 and 21. The delay elements 14, 15, 16 and 17 and the switching systems 18, 19, 20 and 21 form a data traffic control system. In the present embodiment, these delay elements have the following delay times:

delay element 14: $8 \times T_b$
delay element 15: $6 \times T_b$
delay element 16: $4 \times T_b$
delay element 17: $2 \times T_b$, in which $T_b$ again represents the bit period. The fourth column of the table contains the data stream output on the output of the delay elements 14, 15, 16 and 17.

The switching systems 18, 19, 20 and 21 operate in the same way and at the same rotary speed as the previously described switching systems 2, 3, 4 and 5. The switching systems 18, 19, 20 and 21 conduct the bits output on the output of the delay elements 14, 15, 16 and 17 to the appropriate channel again, i.e. to the channel from which they originate. In addition to the internal delay caused by the memory units, the passage of the data stream through a system as shown in FIG. 1 introduces a delay of the outgoing data stream (on data bus 22) by 8 bits with respect to the incoming data stream (on data bus 1) under the influence of the delay elements. The latter can also be seen in the table.

Figure 2:
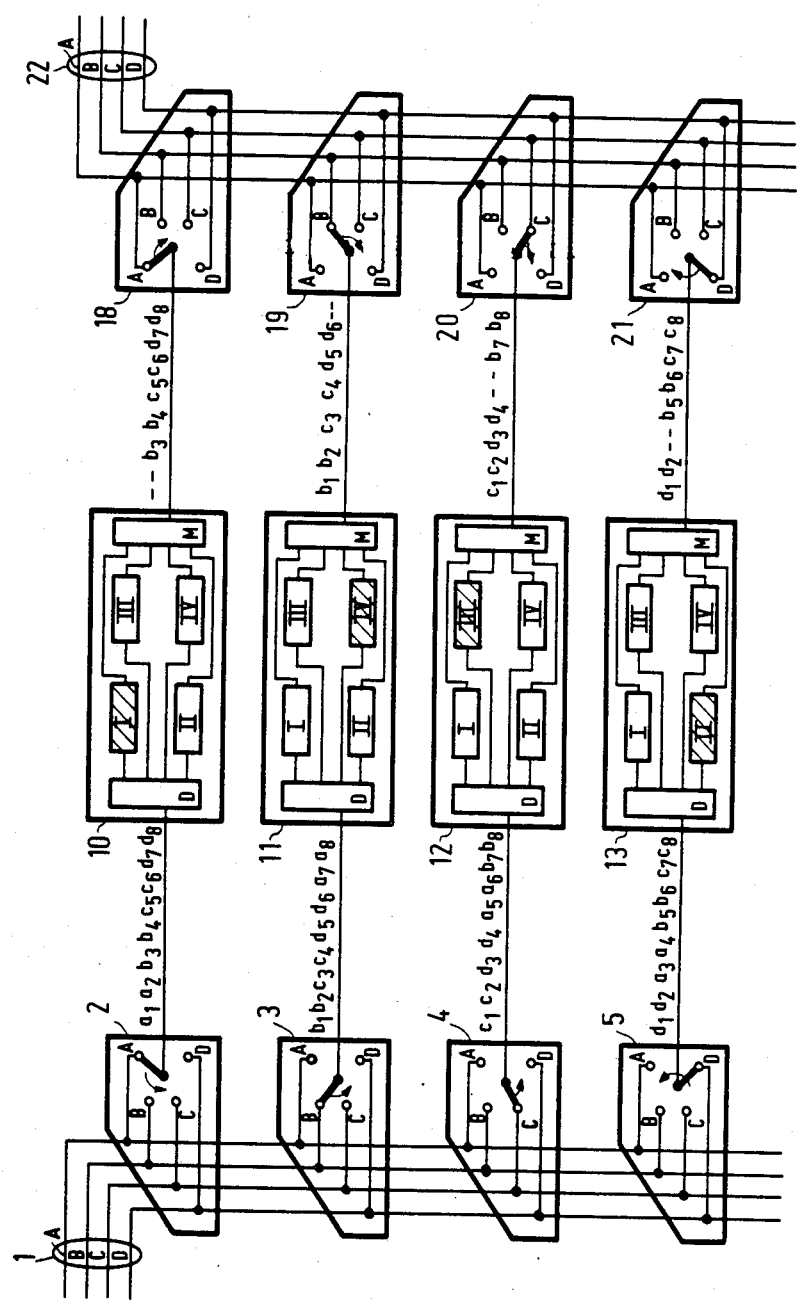
FIG. 2 shows a second embodiment of a series-parallel-series digital system in accordance with the invention.

FIG. 2 shows a second embodiment of a series-parallel-series digital system in accordance with the invention. The digital system is again formed by a series-parallel-series shift register memory system. Parts which correspond to parts shown in FIG. 1 are denoted by corresponding reference numerals. However, in the system shown in FIG. 2 the defective memory element is not always situated in the same location with respect to the demultiplexer rotation in the memory unit. The demultiplexer rotation is assumed to be the same for all memory units. By a suitable choice of the memory units comprising one defective memory element, the delay elements (as shown in FIG. 1) have become superfluous in the present embodiment, so that the data traffic control system comprises merely a switching system. In the embodiment shown in FIG. 2 the defective memory elements are situated in the following locations:

memory unit 10: memory element I
memory unit 11: memory element IV
memory unit 12: memory element III
memory unit 13: memory element II.

The data streams as output on the output of the switching systems 2, 3, 4 and 5 are shown in the Figure. Under the influence of the demultiplexer D of the memory unit 10 the bits $a_1$, $a_2$ which are output on the output of the switching system 2 are conducted to the defective memory element I. Consequently, the bits on the output of the memory unit 10 which originate from the memory element I will contain unreliable information. Because the other memory elements are not defective, the bits $b_3$, $b_4$, $c_5$, $c_6$, $d_7$, $d_8$ will contain reliable information. The bits $a_7$ and $a_8$ are conducted to the defective memory element IV of the memory unit 11. Consequently, no reliable information will be present on the output of the memory unit 11 at the location of the bits $a_7$ and $a_8$. For the memory units 12 and 13 the bits $a_5$, $a_6$ and $a_3$, $a_4$ will be conducted to the defective memory elements III and II, respectively, in the same manner. The data stream in the channel A of the second data bus 22 thus contains unreliable information, while reliable information is present in the other channels. The passage of the data stream through the system as shown in FIG. 2 involves no delay other than the internal delay introduced by the memory units.

It will be apparent that the invention is not restricted to series-parallel-series shift register units as shown in FIG. 1 or 2. The invention can be used in any series-parallel-series digital system and for the digital units use can be made equally well of microprocessors, ALU's as well as any other series-parallel-series digital unit.

It has already been stated that the various elements of the digital unit need not always be activated in the same sequence by the associated demultiplexer. The sequence within the units may in principle differ from one unit to another, because the routing through the non-defective and defective elements is performed by cooperation of the demultiplexer of the unit and the respective data traffic control system.

CCD (Charge Coupled Devices) or bubble memories are series-parallel-series digital units in which defective elements occur regularly. Therefore, the use of the invention represents an attractive solution for such memories.

TABLE

| delay element | word presented to the input | | | | | | | | word output on the output | | | | | | | |
|---|---|---|---|---|---|---|---|---|---|---|---|---|---|---|---|---|
| 6 | $a_1$ | $a_2$ | $b_3$ | $b_4$ | $c_5$ | $c_6$ | $d_7$ | $d_8$ | $a_1$ | $a_2$ | $b_3$ | $b_4$ | $c_5$ | $c_6$ | $d_7$ | $d_8$ |
| 7 | $b_1$ | $b_2$ | $c_3$ | $c_4$ | $d_5$ | $d_6$ | $a_7$ | $a_8$ | $a_7'$ | $a_8'$ | $b_1$ | $b_2$ | $c_3$ | $c_4$ | $d_5$ | $d_6$ |
| 8 | $c_1$ | $c_2$ | $d_3$ | $d_4$ | $a_5$ | $a_6$ | $b_7$ | $b_8$ | $a_5'$ | $a_6'$ | $b_7'$ | $b_8'$ | $c_1$ | $c_2$ | $d_3$ | $d_4$ |
| 9 | $d_1$ | $d_2$ | $a_3$ | $a_4$ | $b_5$ | $b_6$ | $c_7$ | $c_8$ | $a_3'$ | $a_4'$ | $b_5'$ | $b_6'$ | $c_7'$ | $c_8'$ | $d_1$ | $d_2$ |
| 14 | $a_1$ | $a_2$ | — | — | $c_5$ | $c_6$ | $d_7$ | $d_8$ | $a_1'$ | $a_2'$ | — | — | $c_5'$ | $c_6'$ | $d_7'$ | $d_8'$ |
| 15 | $a_7'$ | $a_8'$ | — | — | $c_3$ | $c_4$ | $d_5$ | $d_6$ | — | — | $c_3'$ | $c_4'$ | $d_5'$ | $d_6'$ | $a_7'$ | $a_8'$ |
| 16 | $a_5'$ | $a_6'$ | — | — | $c_1$ | $c_2$ | $d_3$ | $d_4$ | $c_1'$ | $c_2'$ | $d_3'$ | $d_4'$ | $a_5'$ | $a_6'$ | — | — |
| 17 | $a_3'$ | $a_4'$ | — | — | $c_7'$ | $c_8'$ | $d_1$ | $d_2$ | $d_1'$ | $d_2'$ | $a_3'$ | $a_4'$ | — | — | $c_7'$ | $c_8'$ |

What is claimed is:

1. A series-parallel-series digital arrangement with at least a storage function, comprising a first number of n (n>1) series-parallel-series digital units, each digital unit comprising a second number of k (k>1) parallel connected elements at least one of which is defective and at least z ($1 \leq z < k$) of which is non-defective, for each digital unit there is provided a data traffic control device having a serial connection port connected to a serial input and a serial output of said digital unit to which it is assigned, each of said data traffic control devices having p (p>1, p≧z) parallel connection points for connection to a respective channel of a bus which comprises at least p channels for a bit serial transport of a data stream via each channel, each data traffic control device redistributing said data stream originating from said bus by a successively fetching, within a given period, a number of bits from each of said p channels and for conducting, in cooperation with its assigned digital unit, the bits originating from z different channels through said z non-defective elements and the bits originating from the remaining (p-z) channels through said defective elements of its assigned digital unit, each data traffic control device recognizing in the serial data stream supplied on said serial output of its assigned digital unit the bits originating from respective channels and for supplying at its respective parallel connection points bits originating from a respective channel, the same z channels being selected for all digital units of the arrangement.

2. A series-parallel-series digital arrangement as claimed in claim 1, characterized in that each data traffic control system comprises a first and a second data traffic control sub-system, each of which comprises a serial connection point and p parallel connection points, the serial connection point of said first data traffic control sub-system being connected to said serial input of its digital unit, said serial connection point of said second data traffic control sub-system being connected to said serial output of its digital unit.

3. A series-parallel-series digital arrangement as claimed in claim 2, characterized in that said first and the second data traffic control sub-system comprise a first and a second switching system, respectively, comprising p switching positions which are successively activated in order to establish a connection between one of said parallel connection points and said serial connection point, the n digital units being positioned with respect to the successive switching positions of their first switching system in such a manner that said defective elements each time receive bits originating from the same channels.

4. A series-parallel-series digital system as claimed in claim 2, characterized in that said data stream presented to said serial input of each digital unit is distributed among the various elements of said unit in a well-defined sequence, the z non-defective elements in each digital unit being situated in the same location with respect to said sequence, said first and said second data traffic control sub systems comprising a first and a second switching system, respectively, comprising p switching positions which are successively activated in order to establish a connection between one of said parallel connection points and said serial connection point, in series with each digital unit there being connected at least one delay element for delaying said data stream between said first and said second switching system by at least one said period.

5. A series-parallel-series digital arrangement as claimed in claims 1 or 2, characterized in that the number of defective elements per digital unit amounts to one.

6. A series-parallel-series digital arrangement as claimed in claims 1 or 2, characterized in that said digital system comprises a shift register memory system.

7. A series-parallel-series digital arrangement as claimed in claim 6, characterized in that said shift register memory is a memory of the type CCD (Charged Coupled Device).

* * * * *